(12) United States Patent
Wan et al.

(10) Patent No.: US 11,594,584 B2
(45) Date of Patent: Feb. 28, 2023

(54) ORGANIC LIGHT-EMITTING DIODE DISPLAY PANEL, MANUFACTURING METHOD THEREOF AND DISPLAY DEVICE

(71) Applicants: Chongqing BOE Optoelectronics Technology Co., Ltd., Chongqing (CN); BOE Technology Group Co., Ltd., Beijing (CN)

(72) Inventors: Bin Wan, Beijing (CN); Min Li, Beijing (CN); Ya Zeng, Beijing (CN); Yulong Sun, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 280 days.

(21) Appl. No.: 16/493,617

(22) PCT Filed: Feb. 15, 2019

(86) PCT No.: PCT/CN2019/075242
§ 371 (c)(1),
(2) Date: Sep. 12, 2019

(87) PCT Pub. No.: WO2019/233121
PCT Pub. Date: Dec. 12, 2019

(65) Prior Publication Data
US 2021/0335933 A1    Oct. 28, 2021

(30) Foreign Application Priority Data

Jun. 8, 2018   (CN) .......................... 201810589788.2

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 51/5259* (2013.01); *H01L 51/56* (2013.01)

(58) Field of Classification Search
None
See application file for complete search history.

(56) References Cited

U.S. PATENT DOCUMENTS

2005/0062174 A1\* 3/2005 Ingle .................. H01L 51/0001
257/788
2015/0155409 A1\* 6/2015 Nakaya .................. H01L 31/18
427/64

(Continued)

FOREIGN PATENT DOCUMENTS

CN    103840087 A    6/2014
CN    103972267 A    8/2014
(Continued)

*Primary Examiner* — Evren Seven

(57) ABSTRACT

An organic light-emitting diode display panel, a manufacturing method of an organic light-emitting diode display panel and a display device are provided. The organic light-emitting diode display panel includes: a substrate; a pixel definition layer, located on the substrate; and an encapsulation layer, located on the pixel definition layer, a desiccant is added to at least one of the pixel definition layer and the encapsulation layer.

16 Claims, 4 Drawing Sheets

(56) References Cited

U.S. PATENT DOCUMENTS

| | | |
|---|---|---|
| 2015/0372256 A1 | 12/2015 | Jiao et al. |
| 2016/0260785 A1 | 9/2016 | Jiao |
| 2017/0345880 A1* | 11/2017 | Kim .................... H01L 51/5246 |
| 2018/0175318 A1 | 6/2018 | Xu et al. |
| 2018/0287097 A1 | 10/2018 | Ni et al. |
| 2019/0280246 A1 | 9/2019 | Chang |

FOREIGN PATENT DOCUMENTS

| | | | | |
|---|---|---|---|---|
| CN | 105826357 A | * | 8/2016 | ............... G09F 9/33 |
| CN | 105826357 A | | 8/2016 | |
| CN | 106935726 A | | 7/2017 | |
| CN | 107452893 A | | 12/2017 | |
| CN | 207116481 U | | 3/2018 | |
| CN | 108511631 A | | 9/2018 | |
| TW | 200401662 A | * | 1/2004 | |

\* cited by examiner

ORGANIC LIGHT-EMITTING DIODE DISPLAY PANEL, MANUFACTURING METHOD THEREOF AND DISPLAY DEVICE

CROSS-REFERENCES TO RELATED APPLICATIONS

The present application claims the priority of the Chinese Patent Application No. 201810589788.2 filed on Jun. 8, 2018 under the name "ORGANIC LIGHT-EMITTING DIODE DISPLAY PANEL, MANUFACTURING METHOD THEREOF AND DISPLAY DEVICE". In this full text, the disclosure of which is incorporated herein by reference as a part of the present application.

TECHNICAL FIELD

Embodiments of the present disclosure relate to an organic light-emitting diode display panel, a manufacturing method of an organic light-emitting diode display panel, and a display device.

BACKGROUND

At present, an organic light-emitting diode (OLED) display panel usually comprises a substrate and an encapsulation layer. A surface of the substrate is provided with a pixel definition layer. The pixel definition layer has a plurality of openings, and an organic light-emitting unit is disposed in each of the openings. The encapsulation layer disposed on a side of the pixel definition layer to isolate the organic light-emitting unit from external environment to avoid the influence of water from the external environment on the organic light-emitting unit.

Because organic light-emitting layer materials and cathode metal materials of the organic light-emitting unit are easily to be affected by the water from the external environment, and the materials for manufacturing the organic light-emitting layer of the organic light-emitting unit contain a certain amount of water, so that a certain amount of water is sealed between the substrate and the encapsulation layer in the process. The certain amount of water releases water vapor to affect the organic light-emitting unit, which damages the organic light-emitting unit due to moisture absorption, and thus the lifetime of OLED display panel is shortened.

SUMMARY

Embodiments of the present disclosure provide an organic light-emitting diode display panel, a manufacturing method of an organic light-emitting diode display panel and a display device.

According to a first aspect of the present disclosure, an organic light-emitting diode display panel is provided, and the organic light-emitting diode display panel comprises:
 a substrate;
 a pixel definition layer, located on the substrate; and
 an encapsulation layer, located on the pixel definition layer, wherein a desiccant is added to at least one of the pixel definition layer and the encapsulation layer.

According to a second aspect of the present disclosure, a display device is provided, and the display device comprises any one of the organic light-emitting diode display panels mentioned above.

According to a third aspect of the present disclosure, a manufacturing method of an organic light-emitting diode display panel is provided, and the manufacturing method comprises:
 providing a substrate;
 forming a pixel definition layer on the substrate; and
 forming an encapsulation layer on the pixel definition layer, wherein a desiccant is added to at least one of the pixel definition layer and the encapsulation layer.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

DETAILED DESCRIPTION

In order to make objects, technical details and advantages of embodiments of the disclosure clear, the technical solutions of the embodiments will be described in a clearly and fully understandable way in connection with the related drawings. It is apparent that the described embodiments are just a part but not all of the embodiments of the disclosure. Based on the described embodiments herein, those skilled in the art can obtain, without any inventive work, other embodiment(s) which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and claims of the present application, are not intended to indicate any sequence, amount or importance, but to distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or mechanical connection, but may include an electrical connection which is direct or indirect. The terms "on," "under," "right," "left" and the like are only used to indicate relative position relationship, and when the position of an object is described as being changed, the relative position relationship may be changed accordingly.

According to an embodiment of the present disclosure, an organic light-emitting diode display panel is provided, and the organic light-emitting diode display panel comprises: a substrate; a pixel definition layer, located on the substrate; and an encapsulation layer, located on the pixel definition layer, wherein a desiccant is added to at least one of the pixel definition layer and the encapsulation layer.

By adding the desiccant to at least one of the pixel definition layer and the encapsulation layer, moisture between the substrate and the encapsulation layer can be removed by the added desiccant, thus moisture absorption of an organic light-emitting diode (OLED) is avoided and the service life of the OLED display panel is prolonged.

Figure 1:
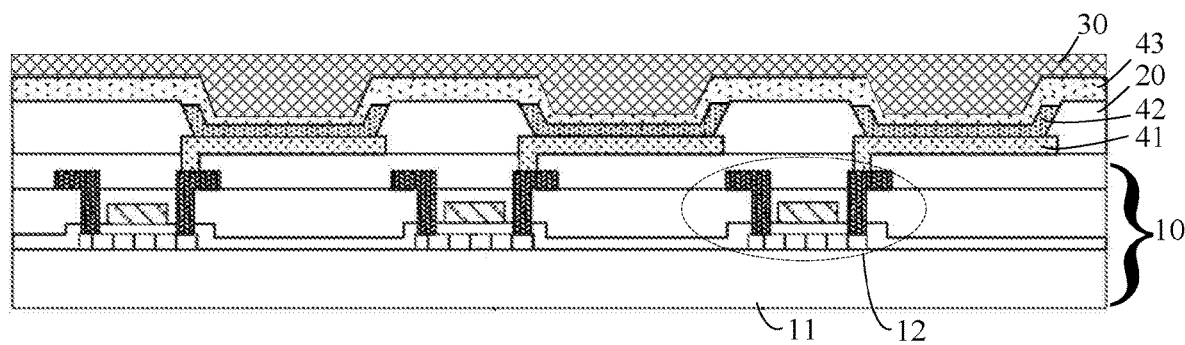
FIG. 1 is a partially schematic diagram of a structure of an OLED display panel provided by an embodiment of the present disclosure.

FIG. 1 is a partially schematic diagram of a structure of an OLED display panel provided by an embodiment of the present disclosure. As illustrated in FIG. 1, the OLED display panel comprises a substrate 10. A pixel definition layer 20 and an encapsulation layer 30 are arranged on the substrate 10. The pixel definition layer 20 is encapsulated between the encapsulation layer 30 and the substrate 10. The desiccant is added to at least one of the pixel definition layer 20 and the encapsulation layer 30.

In at least some embodiments, the desiccant is only added to the pixel definition layer 20. The desiccant in the pixel definition layer 20 can absorb the moisture between the substrate and the encapsulation layer better and avoid the moisture absorption of the OLED.

In at least some embodiments, the desiccant is only added to the encapsulation layer 30. Due to a small amount of moisture in outside air, a conventional encapsulation layer can prevent the moisture in the outside air from contacting the inside of the OLED display panel, but the moisture in the air still slowly penetrates into the OLED display panel. By adding the desiccant into the encapsulation layer, the moisture is limited in the encapsulation layer and cannot further penetrates into the OLED display panel. Thus, the ability of the encapsulation layer to isolate the moisture in the outside air is increased, and the phenomenon that the moisture in the outside air further enters into the inside of the OLED display panel is avoided.

In at least some embodiments, the desiccant are added to both the pixel definition layer 20 and the encapsulation layer 30. The encapsulation layer 30 prevents the moisture in the outside from entering the inside of the OLED display panel. The moisture between the substrate and the encapsulation layer can be absorbed by the pixel definition layer 20 to avoid the moisture absorption of the OLED as much as possible.

In at least some embodiments, the desiccant is added to the encapsulation layer 30, and the OLED display panel further comprises a surface encapsulation layer. The surface encapsulation layer overlays the encapsulation layer 30, and the surface encapsulation layer is not doped with the desiccant. In a high humidity environment, in the case that the surface encapsulation layer is arranged, the surface encapsulation layer serves as the first barrier which can isolate the OLED panel from the external environment and prevent the encapsulation layer 30 from absorbing excessive moisture from the external environment. In this way, a double protection for the OLED panel is formed.

For example, as illustrated in FIG. 1, the substrate 10 comprises a base substrate 11 and a plurality of thin film transistors 12 disposed on the base substrate 11. The plurality of the thin film transistors 12 are disposed on the base substrate 11 in an array. For example, each of the thin film transistors 12 comprises a gate electrode, a gate insulating layer, an active layer, a source electrode, and a drain electrode. Anodes 41 of the OLED distributed in an array are arranged on the substrate 10, and each of the anodes 41 is connected with the source electrode or the drain electrode of the thin film transistor 12.

For example, the base substrate 11 is a transparent substrate, such as a glass substrate, a silicon substrate, a plastic substrate, and so on. The thin film transistors 12 are amorphous silicon thin film transistors, low temperature polycrystalline silicon thin film transistors, or metal oxide thin film transistors. Optionally, the anodes 41 are made of a high work function material with a good conductivity and a good chemical stability, such as indium tin oxide, silver, nickel oxide, graphene and so on. A thickness of each of the anodes is from 1 micron to 2 microns. The anodes 41 correspond to the thin film transistors 12, and the anodes 41 are distributed on the substrate 10 in an array.

For example, the pixel definition layer 20 is made from a base material of the pixel definition layer and the desiccant. The base material of the pixel definition layer is made from a transparent insulating material. As an example, the transparent insulating material is polyimide, silicon nitride or silicon oxide. If the desiccant is only added to the encapsulation layer 30 and no desiccant in the pixel definition layer 20, the pixel definition layer 20 is made from the base material of the pixel definition layer only.

For example, the pixel definition layer 20 is provided with openings at positions corresponding to the anodes 41 to expose the anodes 41. Each of the openings 41 is provided with an organic light-emitting functional layer 42. The organic light-emitting functional layer 42 comprises, but not limited to, a hole injection layer, a hole transport layer, an organic light-emitting layer, an electron transport layer and an electron injection layer which are stacked on the anode 41 in turn. Each of the openings in the pixel definition layer 20 corresponds to a sub-pixel. Because colors of adjacent sub-pixels are different from each other, the materials of the organic light-emitting layer in the adjacent sub-pixels are also different from each other. By arranging the openings, the phenomenon of cross-color between adjacent sub-pixels can be avoided and the quality of the display screen is increased.

For example, the hole injection layer is made of one of copper phthalocyanine, p-dimethylene benzoquinone tetracyanide and titanium oxide phthalocyanine. The hole transport layer is made of triarylamine with biphenyl as a core and diamine biphenyl derivative, and a thickness of the hole transport layer is from 10 nanometers to 50 nanometers. The organic light-emitting functional layer may be a single organic substance, such as 8-hydroxyquinoline aluminium, rubrene, and so on. The organic light-emitting functional layer may also be a mixture, such as 4,4'-N, N'-dicarbazole-biphenyl doped with rubrene. The organic light-emitting functional layer may also be phosphorescent material, or fluorescent material. A thickness of the organic light-emitting functional layer is from 1 nanometer to 50 nanometers. The electron transport layer may be doped with Cesium (Cs) or other material. The electron transport layer may have a thickness from 10 nanometers to 100 nanometers. The electron injection layer may be made of lithium fluoride.

For example, as illustrated in FIG. 1, a cathode 43 is arranged on the organic light-emitting functional layer 42. As an example, in the embodiment, the cathodes 43 on the plurality of the organic light-emitting functional layers 42 are interconnected to form a shared cathode connection for the plurality of the OLEDs. In other implementations, the cathodes 43 on the plurality of the organic light-emitting functional layers 42 may also be disconnected.

For example, in the embodiment, the cathode 43 is made of a metal material with a high conductivity, such as metallic silver. In the manufacturing process, the cathode 43 has sufficiently light transmissive by adjusting the thickness of the cathode during the manufacturing process.

Optionally, the encapsulation layer 30 is made of the base material of the pixel definition layer and the desiccant. The base material of the pixel definition layer comprises any one of polyethylene terephthalate (PET), polyethylene naphthalate (PEN), polycarbonate, polystyrene, polymethyl methacrylate, and polybutylene terephthalate. These base materials of the pixel definition layer can isolate the moisture in the outside better and prevent the moisture from penetrating into the inside of the OLED display panel. The encapsulation layer 30 is an encapsulation thin film. If the desiccant is only added to the pixel definition layer 20 and there is no desiccant in the encapsulation layer 30, the encapsulation layer 30 is only made of the base material of the encapsulation layer. The surface encapsulation layer can also be only made of the base material of the encapsulation layer.

In at least some embodiments, the desiccant is a mixture of a water absorbent resin and at least one of an oxide desiccant and a chloride desiccant. All of the water absorbent resin, the oxide desiccant and the chloride desiccant have a strong absorption capacity for water, and can remove moisture enclosed between the substrate and the encapsulation layer. The oxide desiccant and the chloride desiccant gradually become liquid after absorbing a large amount of water, and easily flow to the organic light-emitting layer or the cathode. The water absorbent resin has a good water retention function, and the formed liquid can be maintained in the water absorbent resin to prevent the liquid from flowing to the organic light-emitting layer or the cathode to cause damage.

In at least some embodiments, the desiccant is a mixture of the oxide desiccant, the chloride desiccant, and the water absorbent resin. A mass ratio of the water absorbent resin, the oxide desiccant and the chloride desiccant is 10:(2~3):(1~1.5). Drying ability of the desiccant is further increased by using the chloride desiccant, the oxide desiccant and the water absorbent resin together. Within the above ratio range, the desiccant has a better moisture absorption capacity and a better water retention capacity.

In at least some embodiments, the water absorbent resin comprises at least one or more selected from the group consisting of polyacrylate, polyvinyl alcohol, polyoxyalkane, polyurethane, acrylate, and casein. Polyacrylate, polyvinyl alcohol, polyoxyalkane, polyurethane, acrylate and casein are common water absorbent resins, which are easy to obtain. A molecular structure of the water absorbent resin is a three-dimensional network structure having a certain crosslink density, and the molecular structure contains a large amount of hydrophilic groups (such as a carboxyl group, a hydroxyl group, a sulfonic acid group, an amide group). The hydrophilic groups can absorb water and connect water molecules in a network structure, so that the water can be maintained in the water absorbent resin, so as to prevent moisture absorbed by the desiccant from accumulating and flowing to the organic light-emitting layer or the cathode to cause damage to the organic light-emitting layer or the cathode.

In at least some embodiments, the chloride desiccant comprises at least one or more selected from the group consisting of zinc chloride, calcium chloride, tin chloride, and antimony chloride. Among the chloride desiccants, zinc chloride, calcium chloride, tin chloride and barium chloride have strong moisture absorption capacity, which can remove moisture in the OLED display panel and prolong the service life of the OLED display panel.

In at least some embodiments, the oxide desiccant comprises at least one of calcium oxide and aluminum oxide. Calcium oxide and aluminum oxide are common oxide desiccants, which are convenient to obtain and low in cost.

For example, in a case that the desiccant is added to both the pixel definition layer 20 and the encapsulation layer 30, the desiccant added to the pixel definition layer 20 is the same as or different from the desiccant added to the encapsulation layer 30.

Figure 2:
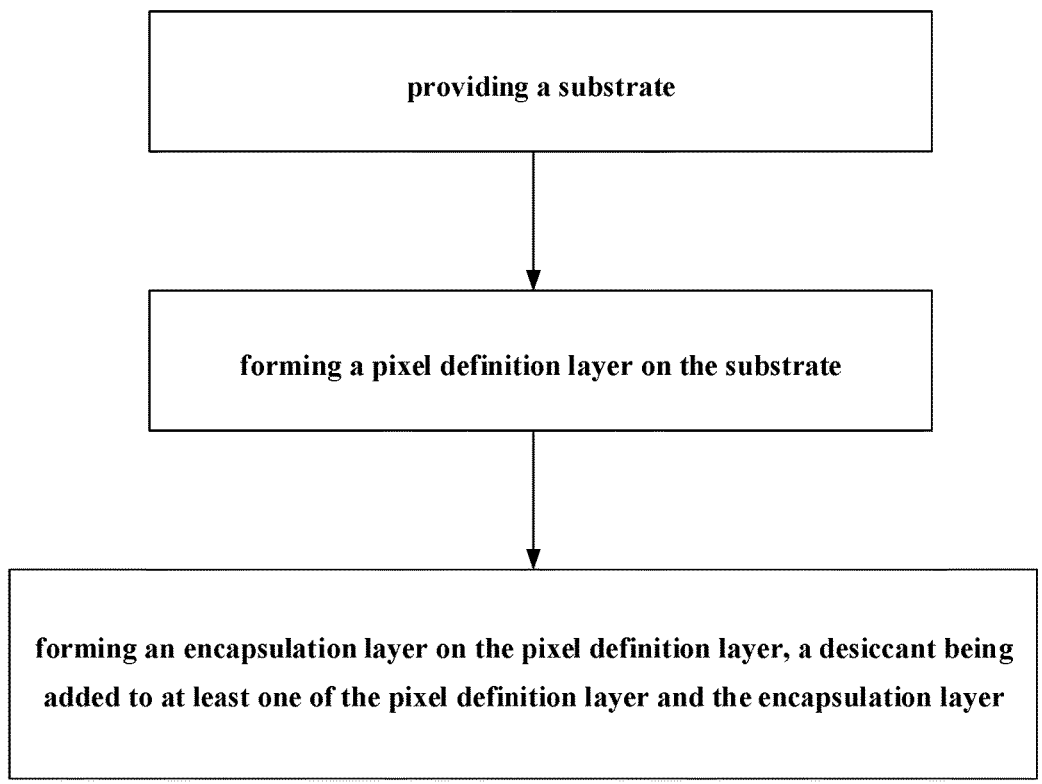
FIG. 2 is a flowchart of a manufacturing method of an OLED display panel provided by an embodiment of the present disclosure.

According to the embodiments of the present disclosure, a manufacturing method of an organic light-emitting diode display panel is further provided, as illustrated in FIG. 2, the manufacturing method comprises:

providing a substrate;

forming a pixel definition layer on the substrate; and forming an encapsulation layer on the pixel definition layer, wherein a desiccant is added to at least one of the pixel definition layer and the encapsulation layer.

By adding the desiccant to at least one of the pixel definition layer and the encapsulation layer, the moisture between the substrate and the encapsulation layer can be removed by the added desiccant, thus moisture absorption of an organic light-emitting diode (OLED) is avoided and the service life of the OLED display panel is prolonged.

Figure 3:
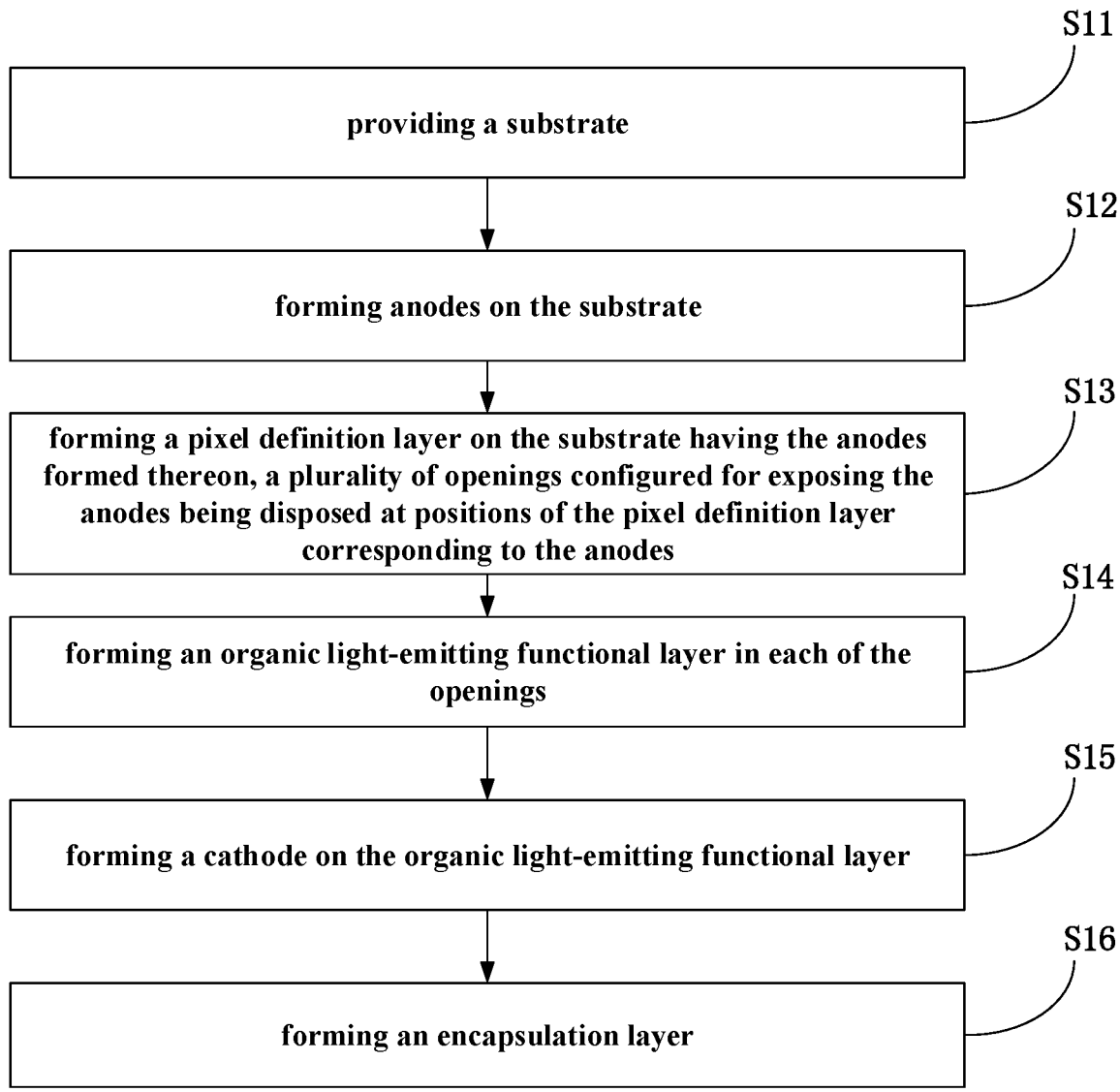
FIG. 3 is a flowchart of a manufacturing method of another OLED display panel provided by an embodiment of the present disclosure.
Figure 5:
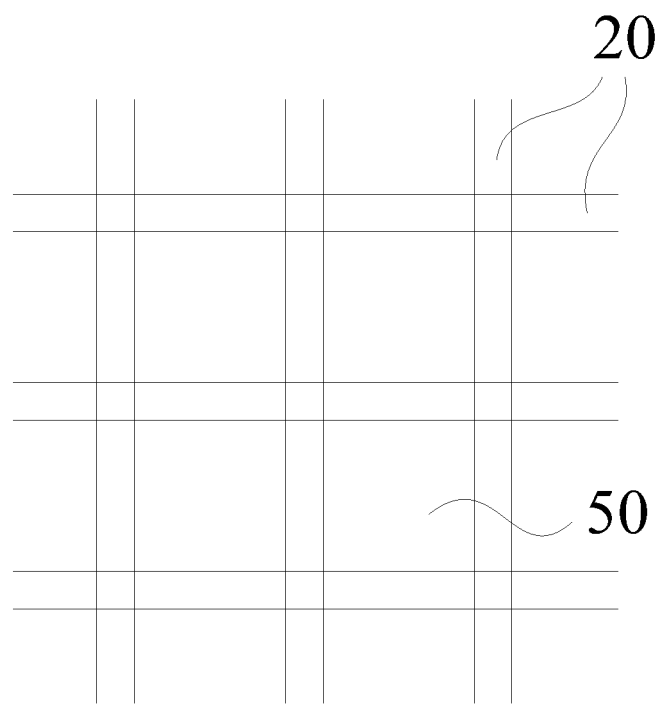
FIG. 5 is a schematic diagram of a pixel definition layer and openings provided by an embodiment of the present disclosure.

FIG. 3 is a flowchart of a manufacturing method of another OLED display panel provided by an embodiment of the present disclosure, the method can be used to manufacture the OLED display panel shown in FIG. 1. As illustrated in FIG. 1, FIG. 3, and FIG. 5, the manufacturing method comprises:

S11: providing a substrate 10.

S12: forming anodes 41 on the substrate 10.

S13: forming a pixel definition layer 20 on the substrate 10 having the anodes 41 formed thereon, a plurality of openings 50 configured for exposing the anodes 41 being disposed at positions of the pixel definition layer 20 corresponding to the anodes 41.

S14: forming an organic light-emitting functional layer 42 in each of the openings 50.

S15: forming a cathode 43 on the organic light-emitting functional layer 42.

S16: forming an encapsulation layer 30. In this way, the pixel definition layer 20, the organic light-emitting functional layer 42 and the cathode 43 are encapsulated between the substrate 10 and the encapsulation layer 30, and the desiccant is added to at least one of the pixel definition layer 20 and the encapsulation layer 30.

By adding the desiccant to at least one of the pixel definition layer and the encapsulation layer, the moisture between the substrate and the encapsulation layer can be removed by the added desiccant, thus moisture absorption of the organic light-emitting diode (OLED) is avoided and the service life of the OLED display panel is prolonged.

In at least some embodiments, the desiccant is only added to the pixel definition layer. The desiccant in the pixel definition layer can absorb the moisture between the substrate and the encapsulation layer better and avoid the moisture absorption of the OLED.

In at least some embodiments, the desiccant is only added to the encapsulation layer. Due to a small amount of moisture in outside air, a conventional encapsulation layer can prevent the moisture in the outside air from contacting the inside of the OLED display panel, but the moisture in the air still slowly penetrates into the OLED display panel. By adding the desiccant into the encapsulation layer, the moisture is limited in the encapsulation layer and cannot further penetrates into the OLED display panel. Thus, the ability of the encapsulation layer to isolate the moisture in the outside air is increased, and the phenomenon that the moisture in the outside air further enters into the inside of the OLED display panel is avoided.

In at least some embodiments, the desiccant are added to both the pixel definition layer and the encapsulation layer. The encapsulation layer prevents the moisture in the outside from entering the inside of the OLED display panel. The moisture between the substrate and the encapsulation layer can be absorbed by the pixel definition layer to avoid the moisture absorption of the OLED as much as possible. The specific composition and content of the desiccant can refer to the descriptions in the above mentioned embodiments, which are omitted herein.

Figure 4:
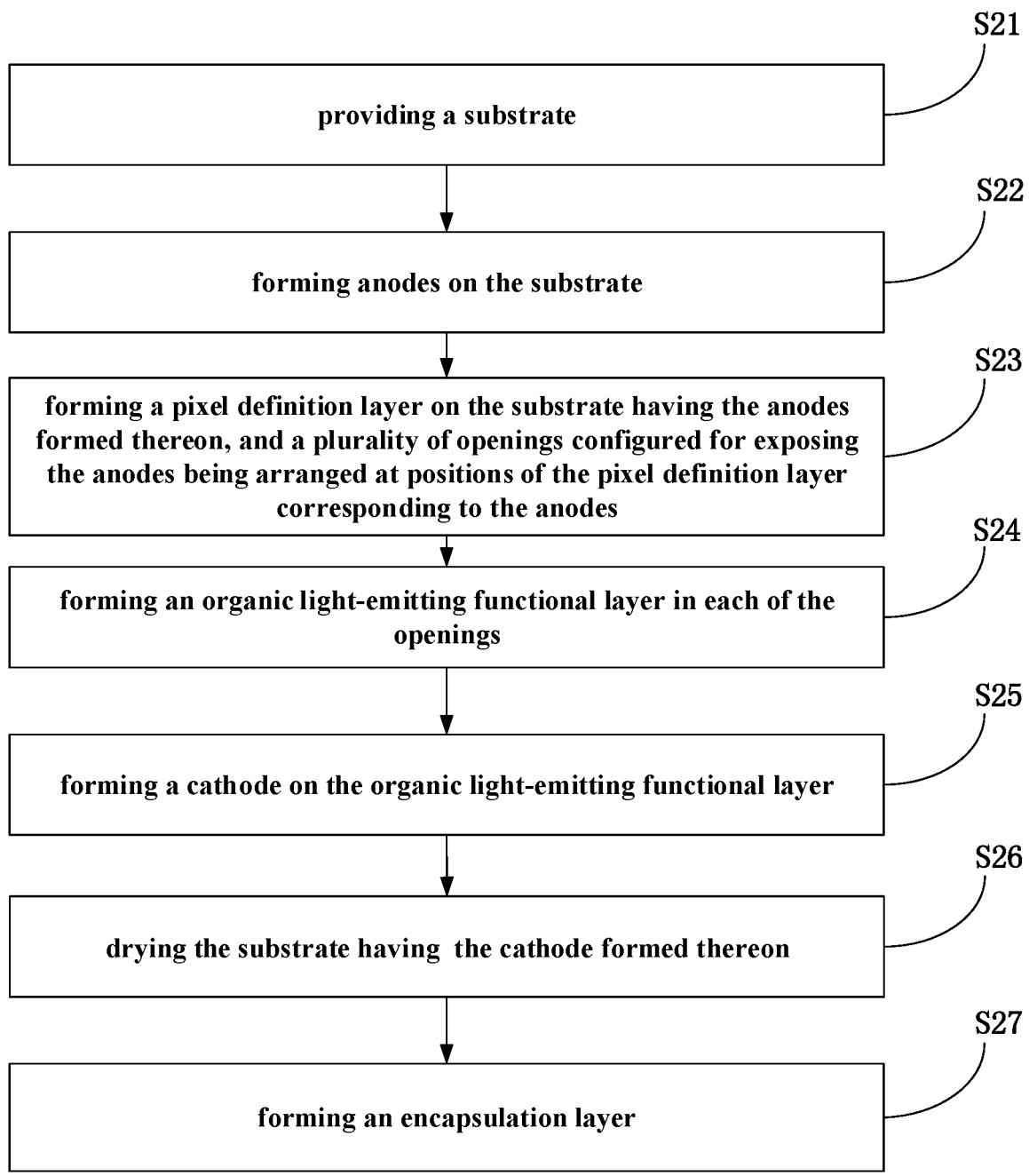
FIG. 4 is a flowchart of a manufacturing method of still another OLED display panel provided by an embodiment of the present disclosure.

FIG. 4 is a flowchart of a manufacturing method of still another OLED display panel provided by an embodiment of the present disclosure, the method can be used to manufacture the OLED display panel shown in FIG. 1. As illustrated in FIG. 1, FIG. 4 and FIG. 5, and the manufacturing method comprises:

S21: providing a substrate 10.

For example, the substrate comprises a base substrate and thin film transistors disposed on the base substrate, and the thin film transistors are disposed on the base substrate in an array. The base substrate is a transparent substrate, such as a glass substrate, a silicon substrate, a plastic substrate, and so on.

S22: forming anodes 41 on the substrate 10.

As an example, the anodes are manufactured by magnetron sputtering method, evaporation method, vapor deposition method, and so on. By forming an anode layer on the substrate and etching the anode layer, a plurality of anodes are formed, and each of the anodes is connected with a source electrode or a drain electrode of a thin film transistor.

The anodes may be made of a high work function material with a good conductivity and a good chemical stability, such as indium tin oxide, silver, nickel oxide, graphene, and so on. A thickness of each of the anodes is from 1 micron to 2 microns.

S23: forming a pixel definition layer 20 on the substrate 10 having the anodes 41 formed thereon, a plurality of openings 50 configured for exposing the anodes 41 being arranged at positions of the pixel definition layer 20 corresponding to the anodes 41.

As an example, the step S23 may comprises:

Forming a base material of the pixel definition layer on the substrate having the anodes formed thereon; adding the desiccant to the base material of the pixel definition layer; using the base material of the pixel definition layer added with the desiccant to form a pixel definition layer film on the substrate; and forming openings in the pixel definition layer by patterning process to obtain the pixel definition layer.

It is not necessary to change the existing process by adding the desiccant to the base material of the pixel definition layer to manufacture the pixel definition layer. The base material of the pixel definition layer is a transparent insulating material. As an example, the transparent insulating material is polyimide, silicon nitride or silicon oxide. An opening is formed in the formed pixel definition layer at position corresponding to each of the anodes, and the anodes are exposed by the corresponding openings.

For example, the pixel definition film layer is formed by a vapor deposition method, a spin coating method or a knife coating method, and the manufacturing methods can be selected according to the base materials of the pixel definition layer. For example, in a case that polyimide is used as the base material of the pixel definition layer, the pixel definition film layer is manufactured by a spin coating or a knife coating. In a case that the spin coating or the knife coating is used to make the pixel definition film layer, the patterning processes comprise pre-baking, exposure, developing, and post-baking. The pre-baking can remove a portion of the moisture in the pixel definition film layer. The exposure process and the developing process can form openings in the pixel definition film layer. The exposure process can solidify regions of the pixel definition layer except for the openings. The post-baking process can remove the moisture in the pixel definition layer again, so that the retained base material of the pixel definition layer is completely solidified and the pixel definition layer is obtained.

The composition of the desiccant may refer to the specific descriptions of the desiccant in the embodiment shown in FIG. 1, which are omitted herein.

S24: forming an organic light-emitting functional layer 42 in each of the openings 50.

For example, the organic light-emitting functional layer comprises a hole injection layer, a hole transport layer, an organic light-emitting layer, an electron transport layer and an electron injection layer which are stacked on the anode in turn. The hole injection layer, the hole transport layer, the organic light-emitting layer, the electron transport layer and the electron injection layer are manufactured by conventional processes.

As an example, the hole injection layer is made of one of copper phthalocyanine, p-dimethylene benzoquinone tetracyanide, and titanium oxide phthalocyanine. The hole injection layer is formed by a chemical vapor deposition method, a physical vapor deposition method, or a spin coating method. The hole transport layer is formed on the base substrate on which the hole injection layer is formed. The hole transport layer is made of triarylamine with biphenyl as a core and diamine biphenyl derivative. A thickness of the hole transport layer is from 10 nanometers to 50 nanometers. The organic light-emitting layer is formed on the substrate on which the hole transport layer is formed by the evaporation method, the spin coating method or the inkjet printing method. The organic light-emitting functional layer is a single organic substance, such as 8-hydroxyquinoline aluminium, rubrene, and so on, and the organic light-emitting functional layer can also be made of a mixture, such as 4,4'-N, N'-dicarbazole-biphenyl doped with rubrene. The organic light-emitting functional layer may also be phosphorescent material, or fluorescent material, A thickness of the organic light-emitting functional layer is from 1 nanometer to 50 nanometers. The electron transport layer may be doped with Cesium (Cs) or other material. The electron transport layer may have a thickness from 10 nanometers to 100 nanometers. The electron injection layer may be made of lithium fluoride.

Each of the openings in the pixel definition layer corresponds to a sub-pixel. Because colors of adjacent sub-pixels are different from each other, the corresponding materials of the organic light-emitting layer in the adjacent sub-pixels are also different from each other. By arranging the openings, the phenomenon of cross-color between adjacent sub-pixels can be avoided.

After the organic light-emitting functional layer is manufactured, the substrate can be dried. Especially in a case that the organic light-emitting functional layer is manufactured by the inkjet printing method, the speed of drying the pigment can be accelerated, and the moisture in the organic light-emitting functional layer can be reduced.

S25: forming a cathode 43 on the organic light-emitting functional layer 42.

For example, the cathode is manufactured by the magnetron sputtering method, the evaporation method or the vapor deposition method. As an example, in the present embodiment, the cathode 43 on the plurality of the organic light-emitting functional layers 42 are interconnected to realize a shared cathode connection for the plurality of the OLEDs. In other possible embodiments, the cathode 43 on the plurality of the organic light-emitting functional layers 42 can also be disconnected.

For example, the cathode is made of a metal material with a high conductivity, such as metallic silver. In the manufacturing process, the cathode has sufficiently light transmissive by adjusting the thickness of the cathode during the manufacturing process.

S26: drying the substrate 10 having the cathode 43 formed thereon.

Because the material for forming the organic light-emitting layer contains a certain amount of moisture, and in the manufacturing process, such as the patterning process, a certain amount of water may be remained on the substrate, so the desiccant in the pixel definition layer may have already absorbed a certain amount of water and the moisture absorption capacity of the desiccant is reduced. After forming the cathode, drying the substrate can remove the moisture absorbed by the desiccant and increase the moisture absorption ability of the desiccant.

S27: forming an encapsulation layer 30.

The organic light-emitting functional layer 42 and the cathode 43 are encapsulated between the substrate 10 and the encapsulation layer 30 by forming the encapsulation layer 30.

For example, before forming the encapsulation layer, the following steps can be included in the method:

Adding the desiccant to a base material of the encapsulation layer; and

Forming an encapsulation layer on the substrate by using the base material of the encapsulation layer added with the desiccant.

For example, the encapsulation layer is formed by a plasma enhanced chemical vapor deposition (PECVD) method. The base material of the encapsulation layer can be any one of the materials of polyethylene terephthalate (PET), polyethylene naphthalate (PEN), polycarbonate, polystyrene, polymethyl methacrylate, and polybutylene terephthalate. The above materials can better isolate moisture from the outside and prevent moisture from penetrating into the inside of the OLED display panel.

The desiccant added to the base material of the encapsulation layer may be the same as the desiccant added to the base material of the pixel definition layer. The specific composition of the desiccant may refer to the descriptions about the desiccant in the above mentioned embodiments.

In the implementation, the desiccant can be added to only one of the pixel definition layer and the encapsulation layer, or added to both the pixel definition layer and the encapsulation layer. If the desiccant is only added to the pixel definition layer, the encapsulation layer is made of the base material of the encapsulation layer without the desiccant in the step S27. If the desiccant is only added to the encapsulation layer, the base material of the pixel definition layer without the desiccant is used to make the pixel definition layer in the step S23.

Optionally, in a case that the encapsulation layer is added with the desiccant, the method further comprises: forming a surface encapsulation layer on the encapsulation layer. The surface encapsulation layer can be formed by the base material of the encapsulation layer, and the manufacturing process of the surface encapsulation layer can be the same as that of the encapsulation layer. The surface encapsulation layer is coated on the encapsulation layer, and the surface encapsulation layer is not doped with the desiccant. In a high humidity environment, in the case that the surface encapsulation layer is arranged, the surface encapsulation layer serves as the first barrier which can isolate the OLED panel from the external environment and prevent the encapsulation layer from absorbing excessive moisture from the external environment.

The embodiment of the present disclosure further provides a display device, the display device comprises any one of the OLED display panels mentioned above. The display device can be a mobile phone, a tablet computer, a display, a navigator, or any other devices having a display function.

In the present disclosure, the following points need to be explained:

(1) The drawings of the embodiments of the present disclosure are only related to the structures related to the embodiments of the present disclosure, and other structures can refer to general designs.

(2) For clarity, in the drawings for describing the embodiments of the present disclosure, a thickness of a layer or a thickness of a region is exaggerated or reduced, that is, these drawings are not drawn according to an actual scale.

(3) In the absence of conflict, the embodiments of the present disclosure and the features in the embodiments can be combined with each other to obtain new embodiments.

What is described above is related to the illustrative embodiments of the disclosure only and not limitative to the scope of the disclosure. Therefore, the scopes of the disclosure are defined by the accompanying claims.

The invention claimed is:

1. An organic light-emitting diode display panel, comprising:
   a substrate;
   a pixel definition layer, located on the substrate and comprising a plurality of openings;
   an encapsulation layer, located on the pixel definition layer and comprising a base material and a desiccant added into the base material, wherein the desiccant is added to both the pixel definition layer and the encapsulation layer;
   an organic functional layer provided in each of the plurality of the openings; and
   a surface encapsulation layer, located on a side of the encapsulation layer away from the substrate, the surface encapsulation layer being not doped with the desiccant,
   wherein the surface encapsulation layer is made of the base material of the encapsulation layer, the base material of the encapsulation layer is selected from a group consisting of polyethylene terephthalate, polyethylene naphthalate, polycarbonate, polystyrene, polymethyl methacrylate, poly(di-(p-phenylene ethyl) sulfone) and polybutylene terephthalate,
   wherein the encapsulation layer and the surface encapsulation layer having same base material.

2. The organic light-emitting diode display panel according to claim 1, wherein the desiccant is a mixture of a water absorbent resin and at least one of an oxide desiccant and a chloride desiccant.

3. The organic light-emitting diode display panel according to claim 2, wherein the desiccant is the mixture of the oxide desiccant, the chloride desiccant and the water absorbent resin, and a mass ratio of the water absorbent resin, the oxide desiccant and the chloride desiccant is 10:(2~3):(1~1.5).

4. The organic light-emitting diode display panel according to claim 2, wherein the water absorbent resin comprises at least one or more selected from the group consisting of polyacrylate, polyvinyl alcohol, polyoxyalkane, polyurethane, acrylate, and casein.

5. The organic light-emitting diode display panel according to claim 2, wherein the chloride desiccant comprises at least one or more selected from the group consisting of zinc chloride, calcium chloride, tin chloride, and antimony chloride.

6. The organic light-emitting diode display panel according to claim 2, wherein the oxide desiccant comprises at least one of calcium oxide and aluminum oxide.

7. A display device, comprising an organic light-emitting diode display panel, wherein the organic light-emitting diode display panel comprises:
a substrate;
a pixel definition layer, located on the substrate and comprising a plurality of openings;
an encapsulation layer, located on the pixel definition layer and comprising a base material and a desiccant added into the base material, wherein the desiccant is added to both the pixel definition layer and the encapsulation layer;
an organic functional layer provided in each of the plurality of openings; and
a surface encapsulation layer, located on a side of the encapsulation layer away from the substrate, the surface encapsulation layer being not doped with the desiccant,
wherein the surface encapsulation layer is made of the base material of the encapsulation layer, the base material of the encapsulation layer is selected from a group consisting of polyethylene terephthalate, polyethylene naphthalate, polycarbonate, polystyrene, polymethyl methacrylate, poly(di-(p-phenylene ethyl) sulfone) and polybutylene terephthalate,
wherein the encapsulation layer and the surface encapsulation layer having same base material.

8. A manufacturing method of an organic light-emitting diode display panel, comprising:
providing a substrate;
forming a pixel definition layer on the substrate;
forming an encapsulation layer on the pixel definition layer, wherein a desiccant is added to both the pixel definition layer and the encapsulation layer; and
forming a surface encapsulation layer on a side of the encapsulation layer away from the substrate, the surface encapsulation layer being not doped with the desiccant,
wherein before forming the pixel definition layer on the substrate, the manufacturing method further comprises:
forming an anode on the substrate,
wherein the forming the pixel definition layer on the substrate comprises: forming the pixel definition layer on the substrate having the anode formed thereon, and the pixel definition layer comprises a plurality of openings for exposing the anode,
wherein the forming the pixel definition layer on the substrate having the anode formed thereon, comprising:
forming a base material of the pixel definition layer on the substrate having the anode formed thereon;
adding the desiccant to the base material of the pixel definition layer;
forming a pixel definition film layer on the substrate by using the base material of the pixel definition layer added with the desiccant; and
forming the plurality of the openings in the pixel definition film layer by using a patterning process to obtain the pixel definition layer,
wherein the forming the encapsulation layer comprising:
adding the desiccant to a base material of the encapsulation layer;
forming the encapsulation layer on the substrate by using the base material of the encapsulation layer added with the desiccant,
wherein the surface encapsulation layer is made of the base material of the encapsulation layer, the base material of the encapsulation layer is selected from a group consisting of polyethylene terephthalate, polyethylene naphthalate, polycarbonate, polystyrene, polymethyl methacrylate, poly(di-(p-phenylene ethyl) sulfone) and polybutylene terephthalate,
wherein the encapsulation layer and the surface encapsulation layer having same base material.

9. The manufacturing method according to claim 8, wherein the desiccant is a mixture of a water absorbent resin and at least one of an oxide desiccant and a chloride desiccant.

10. The manufacturing method according to claim 9, wherein the water absorbent resin comprises at least one or more selected from the group consisting of polyacrylate, polyvinyl alcohol, polyoxyalkane, polyurethane, acrylate, and casein.

11. The manufacturing method according to claim 9, wherein the chloride desiccant comprises at least one or more selected from the group consisting of zinc chloride, calcium chloride, tin chloride, and antimony chloride.

12. The manufacturing method according to claim 9, wherein the oxide desiccant comprises at least one of calcium oxide and aluminum oxide.

13. The manufacturing method according to claim 8, wherein before forming the encapsulation layer, the manufacturing method further comprises:
forming an organic functional layer in each opening of the pixel definition layer;
forming a cathode on the organic functional layer,
wherein the pixel definition layer, the organic functional layer and the cathode are encapsulated between the substrate and the encapsulation layer.

14. The manufacturing method according to claim 8, wherein before forming the encapsulation layer, the manufacturing method further comprises:
drying the substrate having the cathode formed thereon.

15. The organic light-emitting diode display panel according to claim 1, wherein the desiccant added to the pixel definition layer and the desiccant added to the encapsulation layer are the same.

16. The organic light-emitting diode display panel according to claim 1, wherein the desiccant comprises a first desiccant added to the pixel definition layer and a second desiccant added to the encapsulation layer, the first desiccant and the second desiccant are different from each other.

* * * * *